United States Patent
Kim

(10) Patent No.: US 9,293,630 B2
(45) Date of Patent: Mar. 22, 2016

(54) SEMICONDUCTOR PACKAGE AND METHOD OF FORMING SEMICONDUCTOR PACKAGE

(71) Applicant: Dongbu HiTek Co., Ltd., Gyeonggi-do (KR)

(72) Inventor: Sunghyok Kim, Gyeonggi-do (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 11 days.

(21) Appl. No.: 13/834,181

(22) Filed: Mar. 15, 2013

(65) Prior Publication Data

US 2014/0070353 A1    Mar. 13, 2014

(30) Foreign Application Priority Data

Sep. 7, 2012   (KR) .................. 10-2012-0099235

(51) Int. Cl.
| | | |
|---|---|---|
| *H01L 29/24* | (2006.01) | |
| *H01L 31/02* | (2006.01) | |
| *H01L 31/18* | (2006.01) | |
| *H01L 27/146* | (2006.01) | |

(52) U.S. Cl.
CPC ............ *H01L 31/18* (2013.01); *H01L 27/1464* (2013.01); *H01L 27/1469* (2013.01); *H01L 27/14623* (2013.01); *H01L 27/14627* (2013.01); *H01L 27/14634* (2013.01); *H01L 27/14636* (2013.01); *H01L 31/02002* (2013.01)

(58) Field of Classification Search
CPC .................. H01L 31/0203; H01L 27/14618; H01L 2924/01079; H01L 2224/48091; H01L 2924/01078; H01L 2924/01013; H01L 2924/01014; H01L 2924/01029; H01L 2924/14; H01L 24/05

USPC ......... 257/433–434, 621–622, 738, 676–732, 257/779–780, 48; 438/33, 68, 113–114, 438/458, 460, 462, 465, 629, 637–638, 672, 438/675

See application file for complete search history.

(56) References Cited

U.S. PATENT DOCUMENTS

| | | | |
|---|---|---|---|
| 2005/0017333 A1* | 1/2005 | Bohr | ................ H01L 21/76898 257/678 |
| 2006/0111763 A1 | 5/2006 | Kokubo et al. | |
| 2007/0145564 A1* | 6/2007 | Honer | ................ B81C 1/00301 257/690 |
| 2010/0108893 A1* | 5/2010 | Flitsch | ................ H01L 27/1463 250/361 R |
| 2011/0108940 A1* | 5/2011 | Huang | ................ H01L 21/6835 257/447 |
| 2011/0207266 A1* | 8/2011 | Lee | ....................... H01L 21/486 438/126 |
| 2011/0227219 A1* | 9/2011 | Alvarado | ............... H01L 24/03 257/738 |

(Continued)

FOREIGN PATENT DOCUMENTS

| | | |
|---|---|---|
| KR | 10-2006-0115720 | 11/2006 |
| KR | 1020100030354 | 3/2010 |
| KR | 10-2010-0084014 | 7/2010 |

(Continued)

*Primary Examiner* — Steven Loke
*Assistant Examiner* — Didarul Mazumder
(74) *Attorney, Agent, or Firm* — Andrew D. Fortney; Central California IP Group, P.C.

(57) ABSTRACT

A semiconductor package includes a semiconductor substrate which includes a first connection terminal electrically connected to a wiring for signal transfer. The semiconductor package may include a semiconductor support substrate which may be bonded to the semiconductor substrate such that a second connection terminal and the first connection terminal are connected to face each other, and has a through via exposing the second connection terminal.

19 Claims, 6 Drawing Sheets

(56) References Cited

U.S. PATENT DOCUMENTS

Figure 1:
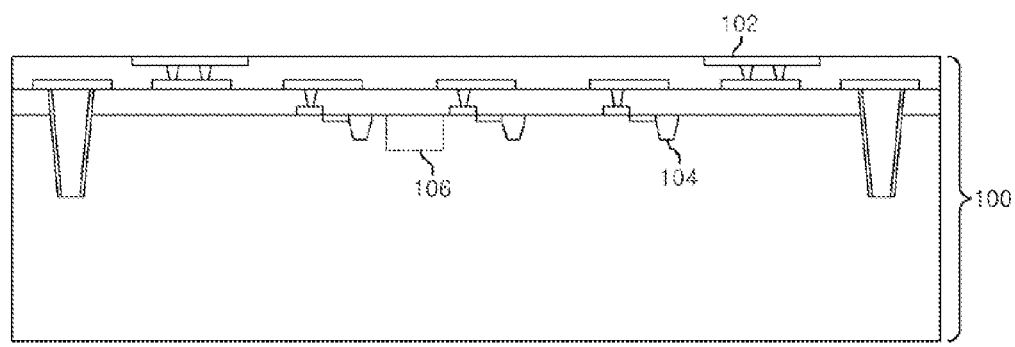

2012/0306038 A1* 12/2012 Chow et al. .................. 257/434
2012/0319282 A1* 12/2012 Uzoh ............... H01L 21/76883
                                                          257/763

FOREIGN PATENT DOCUMENTS

| KR | 1020110038275 | 4/2011 |
| WO | WO 2007/043718 | 4/2007 |

* cited by examiner

SEMICONDUCTOR PACKAGE AND METHOD OF FORMING SEMICONDUCTOR PACKAGE

The present application claims priority to Korean Patent Application No. 10-2012-0099235 (filed on Sep. 7, 2012), which is hereby incorporated by reference in its entirety.

BACKGROUND

CMOS image sensors are devices which converts an optical image to an electrical signal and may be made using a CMOS manufacturing technique. In some CMOS image sensors, MOS transistors may be formed to be associated with a number of pixels. CMOS image sensors may include a switching system for sequentially detecting an output using the MOS transistors to convert signal charges generated in response to light to a voltage which may reproduce image information through signal processing.

CMOS image sensors may have several advantages. Compared to a driving system of a CCD image sensor, CMOS image sensor may implement various scanning systems to integrate a signal processing circuit in a single chip, thereby minimizing the size of a CMOS image sensors. If a compatible CMOS technique is used, manufacturing costs may be minimized and low power consumption may be accomplished.

With the development of techniques for manufacturing an image sensor, the size of photodiodes has gradually reduced with these developments, resulting in an increase in the number of pixels while maintaining the chip size. Accordingly, the area of the light-receiving portion may be reduced, which may cause a degradation in image quality in some circumstances. An image sensor may have a front illumination structure in which a photodiode is formed in a bottom portion of a substrate and/or a logic circuit formed in the top portion of the substrate, with light irradiated onto the top surface of the substrate during operation. However, since light loss may be caused by various overlying layers formed on the photodiode, satisfactory light responsiveness of the photodiode may not be consistently obtainable. Furthermore, since the penetration depth of a photon is large, there is a difficulty in changing a light flux to be emitted to a photocharge.

A back-side illumination (BSI) image sensor is a type of image sensor in which light may be received from the back side of a wafer. In a BSI image sensor a step on a light-receiving portion may be minimized, which may eliminate and/or minimize a light interference phenomenon due to metal routing. In a back-side illumination system, unlike a front illumination system, a photodiode may be formed in a first substrate on an upper side and a logic circuit may be formed on a second substrate positioned on a lower side, with the first substrate and the second substrate may be pressed and/or bonded to each other. A bonding technique for implementing BSI may include an oxide-to-oxide process, a metal-to-metal process, and/or a packaging technique for a through silicon via.

A packaging technique using a back-side illumination image sensor of the related art may have complications relating to a wiring process for an electrical connection with an upper connection terminal (e.g. a metal pad) after a through silicon via process.

SUMMARY

Embodiments relate to a technique of manufacturing a semiconductor package in which a connection terminal in a support substrate is bonded to a semiconductor substrate. In embodiments, an image sensor substrate may be exposed through a through via, the through via may be filled with at least one solder ball, and the connection terminal in the image sensor substrate and a printed circuit board (PCB) may be electrically connected together, which may thereby simplify a wiring process for a back-side illumination image sensor.

Embodiments relate to a technique of manufacturing a semiconductor package in which a connection terminal in a support substrate may be bonded to an image sensor substrate is formed using a damascene process. In embodiments, the connection terminal in the image sensor substrate and a printed circuit board may be electrically connected together, thereby simplifying a wiring process for a back-side illumination image sensor.

In embodiments, a semiconductor package may include at least one of the following: (1) a semiconductor substrate which includes a first connection terminal electrically connected to a wiring for signal transfer; and (2) a semiconductor support substrate which is bonded to the semiconductor substrate such that a second connection terminal and the first connection terminal are connected to face each other and has a through via exposing the second connection terminal.

In embodiments, the through via may be filled with a conductive material and electrically connects the first connection terminal, the second connection terminal, and a printed circuit board through the conductive material. In embodiments, the conductive material may be filled in the form of solder balls. In embodiments, the conductive material may include a metal material which is filled using electroplating. In embodiments, the semiconductor substrate may include an image sensor substrate. In embodiments, the second connection terminal may be formed using a damascene process. In embodiments, the through via and the conductive material may be formed using dual a damascene process.

Embodiments relate to a method of forming a semiconductor package, including at least one of the following steps: (1) forming a first connection terminal to be electrically connected to a wiring for signal transfer in a top portion of a semiconductor substrate; (2) forming a second connection terminal on/over the semiconductor support substrate and bonding the semiconductor substrate and a semiconductor support substrate such that the first connection terminal and a second connection terminal face each other; (3) forming a through via on the semiconductor support substrate bonded to the semiconductor substrate to expose the second connection terminal; (4) filling a conductive material in the through via; and/or (5) bonding the semiconductor support substrate and a printed circuit board to electrically connect the first connection terminal, the second connection terminal, and the printed circuit board through the conductive material.

In embodiments, the filling of the conductive material may include filling a metal material in the form of solder balls. In embodiments, the solder balls may include a first solder ball and a second solder ball, with the first connection terminal, the second connection terminal, and the printed circuit board may be electrically connected by the first solder ball and the second solder ball. In embodiments, the filling of the conductive material may include filling of a metal material using electroplating. In embodiments, the method may further comprise after the filling of the conductive material, forming solder balls to electrically connect the first connection terminal, the second connection terminal, and the printed circuit board. In embodiments, the semiconductor substrate may be an image sensor substrate. In embodiments, the semiconductor substrate may include a semiconductor chip. In embodiments, the second connection terminal may be formed using a damascene process. In embodiments, a through via and the conductive material may be formed using dual a damascene process.

According to embodiments, when an upper connection terminal made of a metal material in a semiconductor substrate (e.g. an image sensor substrate) and a printed circuit board (PCB) are electrically connected together, a connection terminal in a support substrate bonded to the image sensor substrate may be exposed through a through via. The through via may be filled with solder balls, according to embodiments. In accordance with embodiments, the connection terminal in the support substrate bonded to the image sensor substrate may be formed using a damascene process to electrically connect the connection terminal in the image sensor substrate and the printed circuit board. Embodiments may improve a process of electrically connecting the connection terminal and the PCB after the through via formation process (e.g. a process for extending a connection line between the connection terminal and the PCB or similar arrangement).

DRAWINGS

The above and other features of embodiments will become apparent from the following description of the embodiments given in conjunction with the accompanying drawings, in which:

Example FIGS. 1 to 6 illustrate process sectional views of a metal wiring and a printed circuit board electrically connected together by solder balls in a manufacturing process of an image sensor, in accordance with embodiments.

Example FIGS. 7 to 10 illustrate process sectional views of a metal wiring and a printed circuit board electrically connected together using a damascene process in a manufacturing process of an image sensor, in accordance to embodiments.

DESCRIPTION

Embodiments relate to a technique of manufacturing a semiconductor package in which a connection terminal in a support substrate bonded to an image sensor substrate is exposed through a through via. The through via may be filled with solder balls to electrically connect the connection terminal in the image sensor substrate and a printed circuit board (PCB), in accordance with embodiments. In embodiments, the connection terminal in the support substrate bonded to the image sensor substrate may be formed using a damascene process to electrically connect the connection terminal in the support substrate and the printed circuit board. Embodiments may simplify a wiring process for a back-side illumination image sensor.

Example FIGS. 1 to 6 are sectional views illustrating a process of a metal wiring and a printed circuit board being electrically connected together by solder balls, in accordance with embodiments. In embodiments, the process is at least part of a process of manufacturing a back-side illumination (BSI) CMOS image sensor as a technique for manufacturing a semiconductor package.

Example FIG. 1 is a process sectional view of a back-side illumination CMOS image sensor, in accordance with embodiments. The upper view of FIG. 1 illustrates a semiconductor substrate 100 which has a back-side illumination CMOS image sensor. The lower view of FIG. 1 illustrates a semiconductor support substrate 200 which is to be bonded to the semiconductor substrate 100. In embodiments, the semiconductor substrate 100 may be a doner wafer including an image sensor (or similar device) and an epitaxial wafer (e.g. SOI (Silicon On Insulator) or similar material).

The semiconductor substrate 100 may include at least one of a first connection terminal 102, an isolation region 104, a light-receiving element 106, and/or multiple wirings, in accordance with embodiments. The semiconductor substrate 100 may be formed by the same method as a typical method of manufacturing a front illumination image sensor or alternative methods.

The first connection terminal 102 may be electrically connected and/or coupled to a wiring for transferring a pixel signal through a light-receiving element 106. The first connection terminal may correspond to an upper metal layer in the semiconductor substrate 100. In embodiments, the light-receiving element 106 may be a photodiode, and a specified light signal is incident on the light-receiving element 106 through color filters, microlenses, and similar or additional devices.

The semiconductor support substrate 200 (e.g. a carrier wafer) may include an epitaxial layer. A second connection terminal 202 which may be connected to the first connection terminal 102 when the semiconductor support substrate 200 may be bonded to the semiconductor substrate 100.

Figure 2:
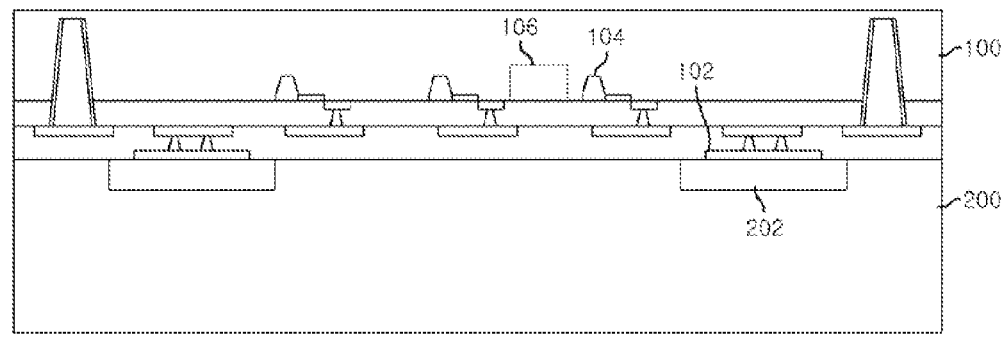

The process sectional view of FIG. 2 illustrates when the semiconductor substrate 100 is reversed vertically and bonded to the semiconductor support substrate 200, in accordance with embodiments. An etch-back process for forming the semiconductor substrate 100 at a prescribed thickness (e.g. at a thickness of 0.5 to 4 μm) may be provided. In embodiments, in order to enhance bonding performance, blank etching may be performed on the semiconductor support substrate 200 and the semiconductor substrate 100 so as to protrude a given portion of the second connection terminal 202.

Figure 3:
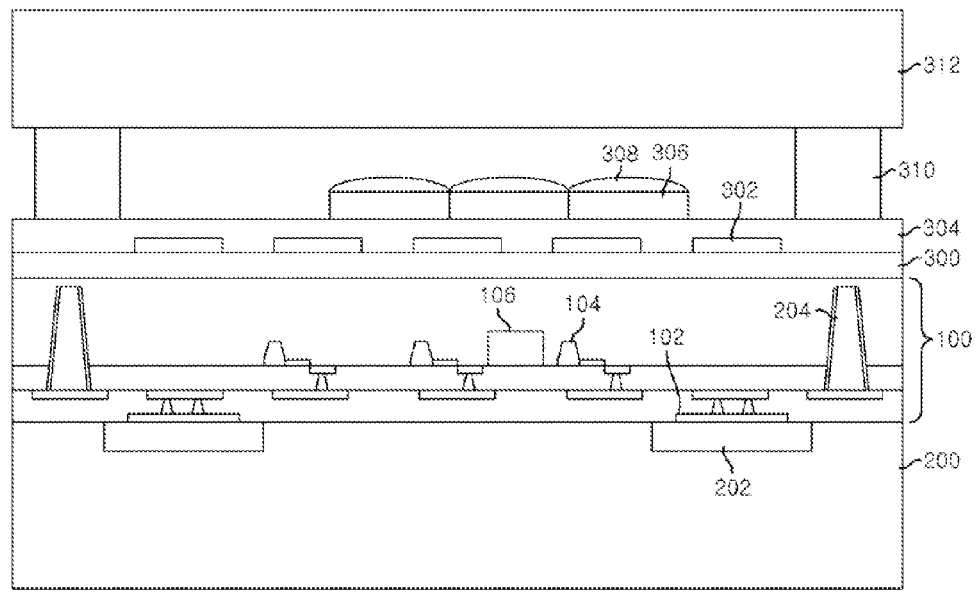

FIG. 3 is a process sectional view illustrated when a first planarization layer 300, a light-shielding film 302, a second planarization layer 304, color filters 306, microlenses 308, and the similar devices are formed on the semiconductor substrate 100 in which a lower portion is partially removed using the etch-back process of FIG. 2, in accordance with embodiments. The light-shielding film 302 may be disposed between the color filters 306 to prevent a light interference phenomenon between pixels. The color filters 306 and the microlenses 308 may be disposed taking into consideration the path of a light signal which is incident on the light-receiving element 106. An adhesive layer 310 may be formed to bond a glass substrate 312.

In embodiments, the back-side illumination CMOS image sensor may include at least one of the semiconductor substrate 100, the first connection terminal 102, the isolation region 104, the light-receiving element 106, the second connection terminal 202, the first and second planarization layers 300 and 304, the light-shielding film 302, the color filters 306, the microlenses 308, the adhesive layer 310, the glass substrate 312, and/or similar devices.

Figure 4:
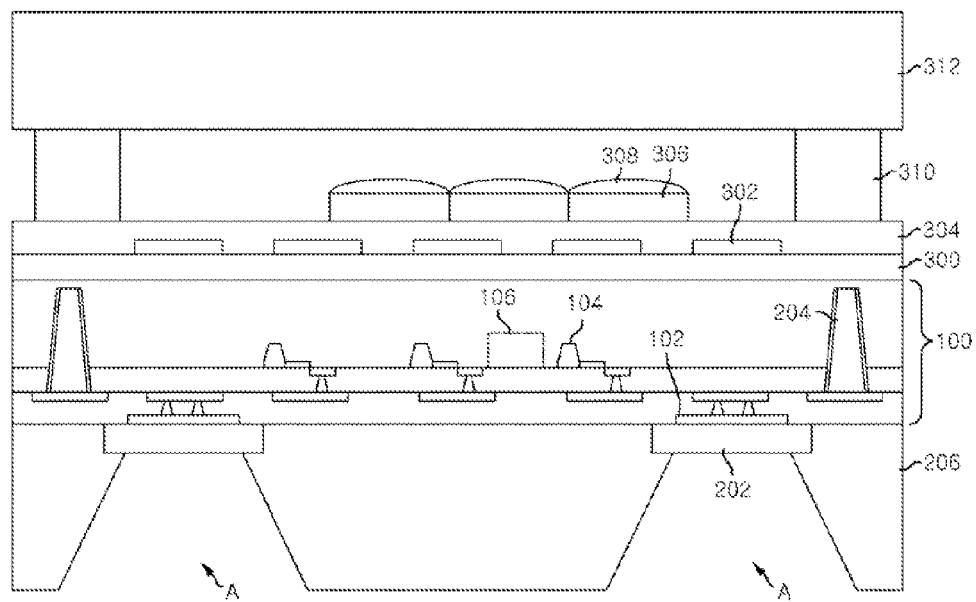

FIG. 4 is a process sectional view showing when a through via A is formed in the back-side illumination CMOS image sensor of FIG. 3 to expose the second connection terminal 202, in accordance with embodiments. In embodiments, prior to forming the through via A, a process for grinding the semiconductor support substrate 200 may be performed. With this grinding process, the semiconductor support substrate 200 may be formed at a prescribed thickness (e.g. at a thickness of 50 to 500 μm), in accordance with embodiments.

The through via A may be formed using a through silicon via (TSV) process, in accordance with embodiments. With this through silicon via process, a part of the semiconductor support substrate 200 may be etched to expose the second connection terminal 202. FIG. 4 illustrates the semiconductor support substrate when the substrate is etched through the through silicon via process to form a second connection terminal for a subsequent wiring process, in accordance with embodiments.

Figure 5:
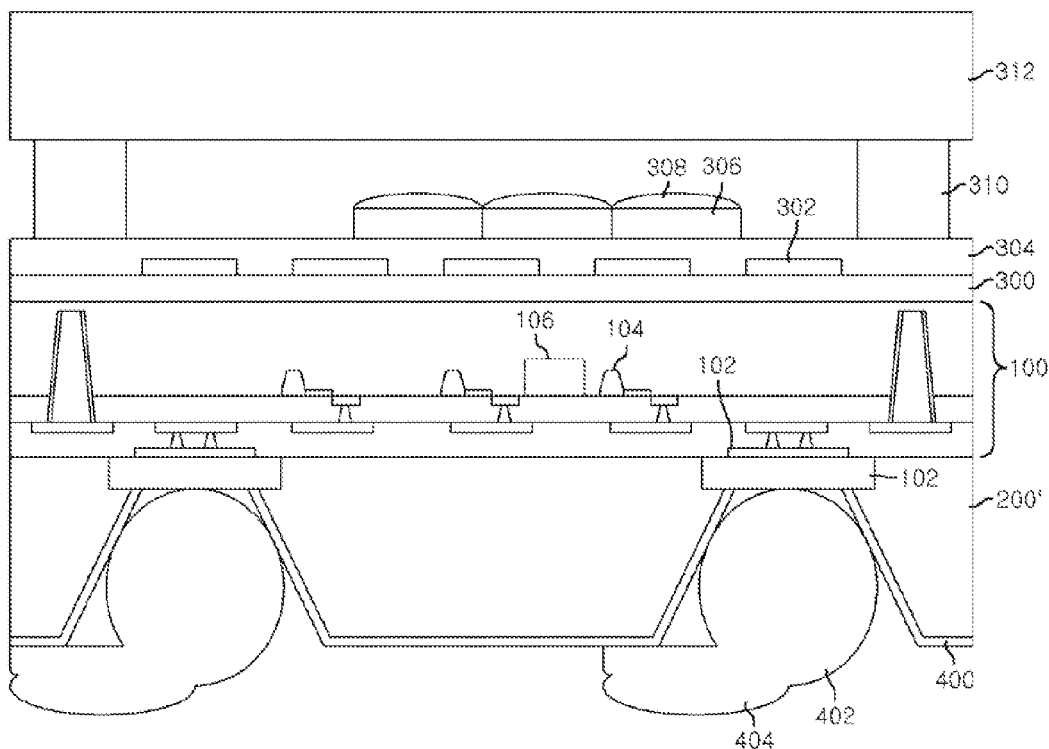

As illustrated in FIG. 5, an insulating material 400 may be deposited on/over the semiconductor support substrate 200 in which the second connection terminal 202 is exposed, with the insulating material 400 on the second connection terminal 202 is partially removed, in accordance with embodiments. In embodiments, the insulating material 400 may include at least one of an oxide, a nitride, and/or similar materials.

In embodiments, in order to partially remove the insulating material 400 to expose the second connection terminal 202 again, an etch-back process and a photomask process may be performed. A conductive material 402 may be formed in the semiconductor support substrate 200' which has a through via A, through which the second connection terminal 202 may be exposed from the insulating material 400, in accordance with embodiments. In accordance with embodiments, FIG. 5 is a process section view illustrating when the through hole A is filled with the conductive material 402 (e.g. solder balls or similar materials). In order to form the solder balls, various techniques may be applied and embodiments are not intended to be limited to a specified technique. Although exemplary embodiments relate to solder balls as the conductive material, other embodiments relate to various kinds of conductive materials which may be used. For example, in embodiments, a metal material (e.g. copper (Cu)) may be filled using electroplating instead of the solder balls. The conductive material 402 according to embodiments may be used as means for electrically connecting the second connection terminal 202 and a printed circuit board.

After the conductive material 402 is filled, solder balls 404 for substrate mounting may be further formed, in accordance with embodiments. In embodiments, solder balls 404 may be used to mount the semiconductor support substrate 200' on a printed circuit board.

Figure 6:
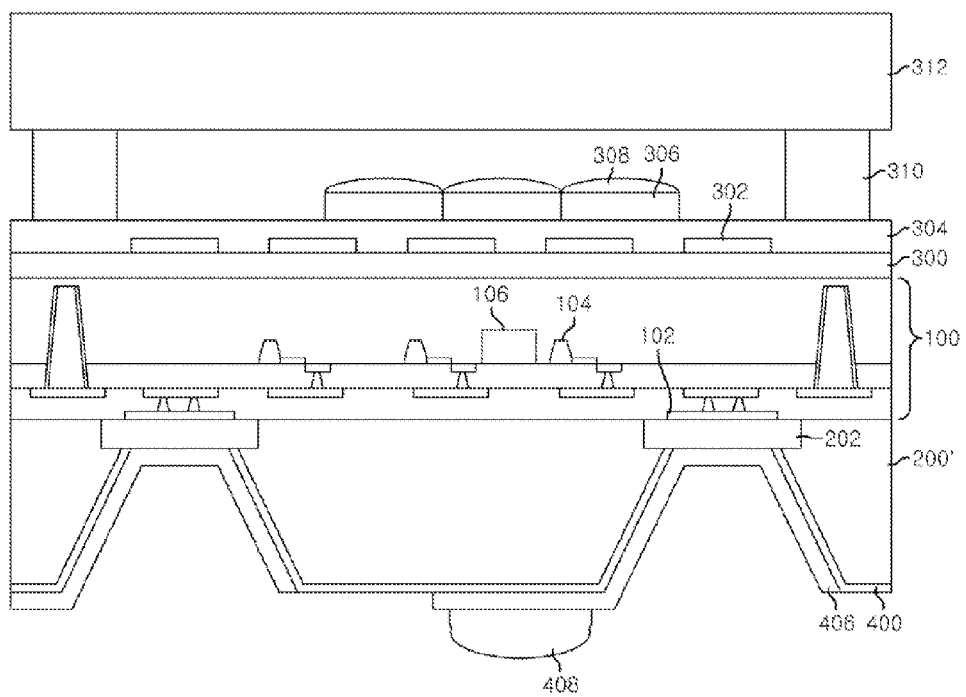

In accordance with embodiments, FIG. 6 is a process sectional view showing when the second connection terminal 202 is exposed, the insulating material 400 is deposited, and a part of the insulating material 400 on the second connection terminal 202 is removed. The insulating material 400 on the second connection terminal 202 may be removed using the etch-back process and/or the photomask process to expose the second connection terminal 202 again, in accordance with embodiments.

As illustrated in FIG. 6, after the process of FIG. 5 is performed, a metal material 406 may be deposited, in accordance with embodiments. In embodiments, after the metal material 406 is deposited, an etching process using a mask process may be performed to form solder balls 408 for a substrate connection. In embodiments, the metal material 406 may be contain at least one of titanium (Ti), titanium nitride (TiN), tantalum (Ta), tantalum nitride (TaN), and/or similar materials.

According to embodiments, when a connection terminal in a semiconductor substrate (e.g. an image sensor substrate) and a printed circuit board are electrically connected together, a connection terminal may be exposed through a through hole. In embodiments, the through hole may be filled with solder balls to electrically connect the connection terminal in the image sensor substrate and the printed circuit board, thereby simplifying a wiring process for a back-side illumination image sensor.

FIGS. 7 to 10 are process sectional views illustrating when a metal wiring and a printed circuit board are electrically connected together, in accordance with embodiments. In embodiments, bonding may be accomplished using a damascene process in a manufacturing process of a back-side illumination CMOS image sensor.

Figure 7:
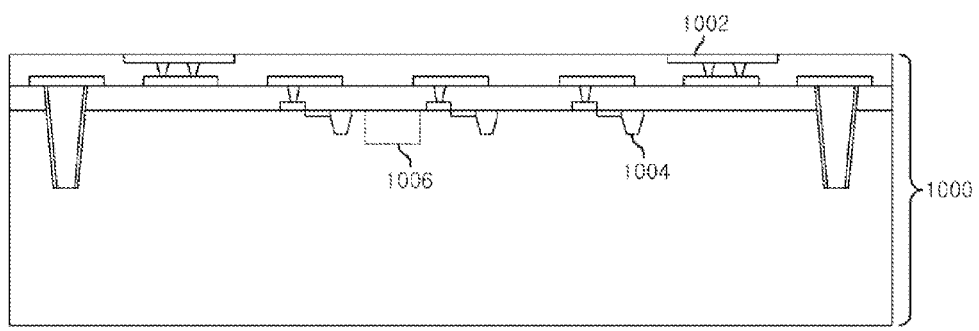
Figure 7:
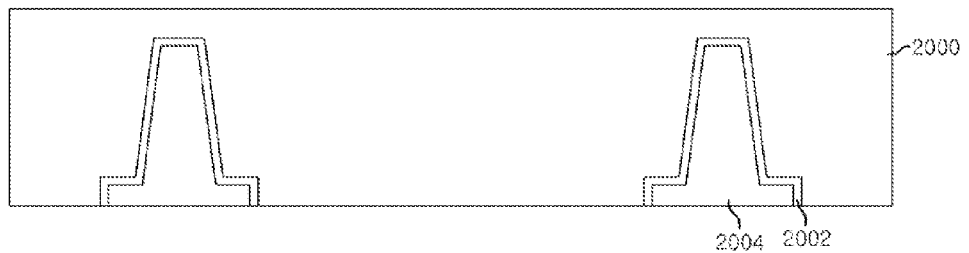

FIG. 7 is a process sectional view of a back-side illumination CMOS image sensor invention, in accordance with embodiments. The upper view of FIG. 7 illustrates a semiconductor substrate 1000 which has a back-side illumination CMOS image sensor, in accordance with embodiments. The lower view of FIG. 7 illustrates a semiconductor support substrate 2000 which is bonded to the semiconductor substrate 1000. In embodiments, the semiconductor substrate 1000 may be a doner wafer including an image sensor (or similar) and an epitaxial wafer/SOI (or similar).

The semiconductor substrate 1000 may include a first connection terminal 1002, an isolation region 1004, a light-receiving element 1006, and multiple wirings, in accordance with embodiments. Embodiments may use the same methods as a typical method of manufacturing a front illumination image sensor.

The first connection terminal 1002 may be electrically connected to a wiring for transferring a pixel signal through the light-receiving element 1006 and may correspond to an upper metal layer in the semiconductor substrate 1000, in accordance with embodiments. In embodiments, the light-receiving element 1006 (e.g. a photodiode) may receive a specified light signal incident on the light-receiving element 1006 through color filters, microlenses, and the similar devices. In embodiments, the semiconductor support substrate 2000 (e.g. a carrier wafer) may include an epitaxial layer. Embodiments may include a second connection terminal 2004 for bonding the semiconductor substrate 1000 to the semiconductor support substrate 2000.

The second connection terminal 2004 formed of copper (Cu), in accordance with embodiments. In embodiments, with regard to the second connection terminal 2004, the semiconductor support substrate 2000 may be ground down to a given thickness (e.g. about 100 to 500 μm) to set the thickness of the wafer to be packaged. The backside of the semiconductor support substrate 2000 may be patterned using a dual damascene process. An insulating film 2022 may be formed using an oxidation process. Copper (Cu) may be filled using electroplating. A CMP process (or similar) may be performed, which may finally implement a structure characterized by the section shown in FIG. 7, in accordance with embodiments.

Figure 8:
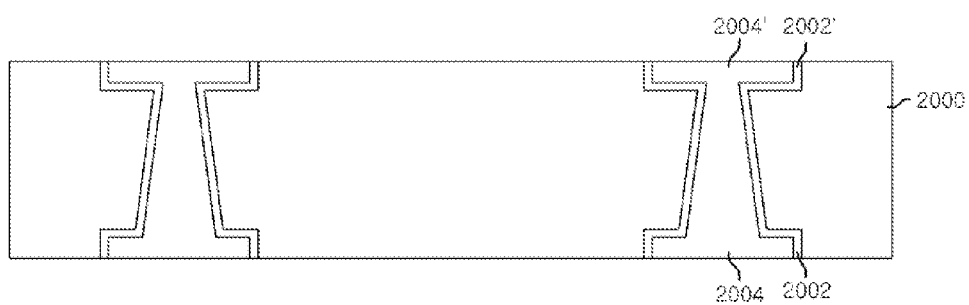

FIG. 8 is a process sectional view illustrating the semiconductor support substrate 2000 of FIG. 7 patterned using a damascene process, in accordance with embodiments. An oxide film 2002' may be deposited. Blank etching or a mask process may be performed to expose only the metal wiring. A metal material 2004' (e.g. copper (Cu)), may be filled. A CMP process (or similar) may be performed.

Figure 9:
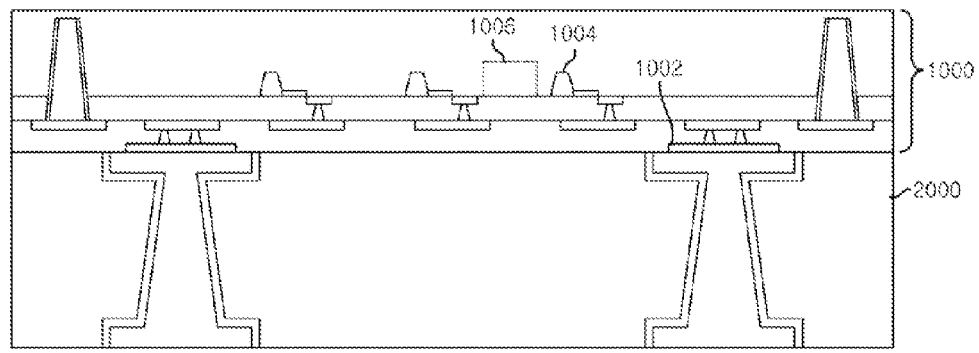

The process section view of FIG. 9 illustrates when the semiconductor support substrate 2000 is bonded to the semiconductor substrate 1000, in accordance with embodiments. In embodiments, an etch-back process for forming the semiconductor substrate 2000 at a prescribed thickness (e.g. at a thickness of 0.5 to 4 μm) may be further provided, in accordance with embodiments. In embodiments, in order to improve bonding performance, blank etching may be performed on the semiconductor support substrate 2000 and the semiconductor substrate 1000 so as to protrude a given portion of the second connection terminal 2002.

Figure 10:
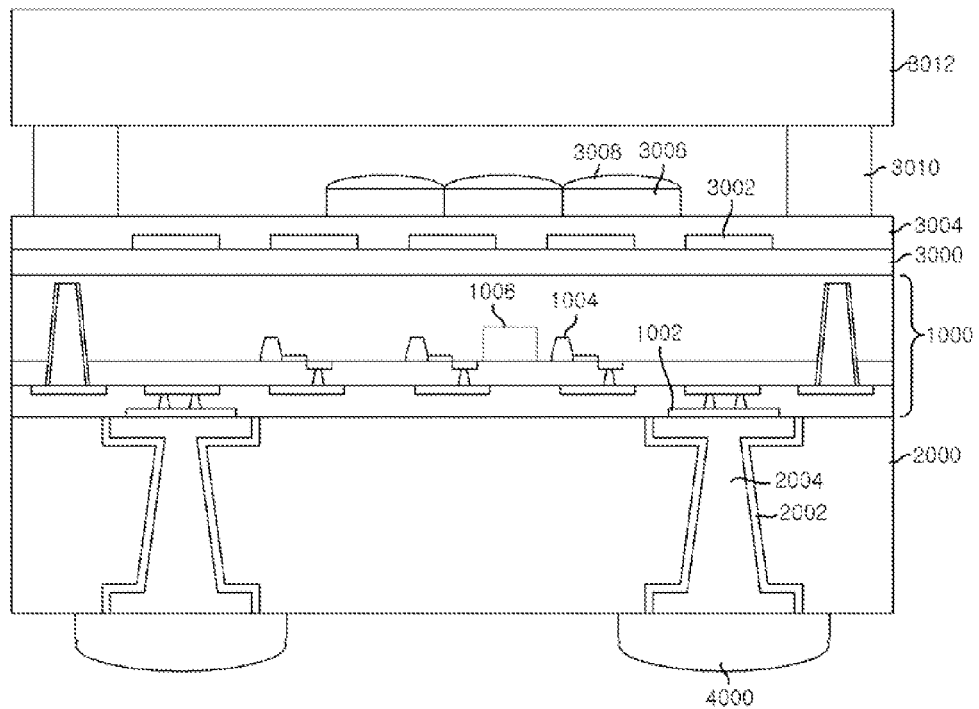

FIG. 10 is a process sectional view illustrating when a first planarization layer 3000, a light-shielding film 3002, a second planarization layer 3004, color filters 3006, microlenses 3008, and similar are formed on/over the semiconductor substrate 1000 in which a lower portion is partially removed using the etch-back process of FIG. 9, in accordance with embodiments. The light-shielding film 3002 may be disposed between the color filters 3006 to prevent a light interference phenomenon between pixels. The color filters 3006 and the microlenses 3008 may be disposed taking into consideration the path of a light signal which is incident on the Light-receiving element 1006.

In embodiments, an adhesive layer 3010 may be formed to bond a glass substrate 3012. Solder balls 4000 for substrate connection may be formed in the semiconductor support substrate 2000 through which the second connection terminal 2004 passes, in accordance with embodiments.

In embodiments, a back-side illumination CMOS image sensor may include at least one of a semiconductor substrate 1000, a first connection terminal 1002, an isolation region 1004, a light-receiving element 1006, a second connection terminal 2002, first and second planarization layers 3000 and 3004, a light-shielding film 3002, color filters 3006, microlenses 3008, an adhesive layer 3010, a glass substrate 3012, solder balls 4000, and/or similar.

According to embodiments, when a connection terminal in a semiconductor substrate (e.g. an image sensor substrate) and a printed circuit board are electrically connected together, a connection terminal in a support substrate bonded to the image sensor substrate may be formed using a damascene process to electrically connect the connection terminal in the image sensor substrate and the printed circuit board together, which may (in embodiments) simplify a wiring process for a back-side illumination image sensor.

With the use of the technique, according to embodiments, a semiconductor chip (e.g. an image sensor chip, a logic chip, or similar) may be bonded and electrically connected to a support substrate. A semiconductor chip may be defined to include a unit element which is formed by dicing multiple elements formed in a semiconductor substrate, in accordance with embodiments.

While embodiments have been shown and described, embodiments are not limited thereto. It will be understood by those skilled in the art that various changes and modifications may be made without departing from the scope of the embodiments as defined in the following claims.

What is claimed is:

1. A method comprising:
    forming a first connection terminal configured for signal transfer by electrical connection to a wiring in a top portion of a semiconductor substrate;
    forming a second connection terminal on a semiconductor support substrate;
    bonding the semiconductor substrate and the semiconductor support substrate such that the first connection terminal and a second connection terminal are bonded to each other;
    after bonding the semiconductor substrate and the semiconductor support substrate, forming a planarization layer, color filters, and microlenses on the semiconductor substrate, forming an adhesive layer on the planarization layer and an outer shell of the color filter and the microlenses, and forming a glass substrate over the color filters and microlenses, wherein the adhesive layer supports the glass substrate;
    after forming the glass substrate over the color filters and microlenses, forming a through via in the semiconductor support substrate exposing the second connection terminal; and
    filling or depositing a conductive material in the through via, the conductive material contacting the second connection terminal.

2. The method according to claim 1, wherein the conductive material comprises a metal material.

3. The method according to claim 2, comprising depositing the conductive material in the through via, and the method further comprises forming solder balls on the conductive material in the through via after depositing the conductive material.

4. The method according to claim 3, wherein the solder balls are formed on the conductive material.

5. The method according to claim 4, further comprising bonding the semiconductor support substrate and a printed circuit board to electrically connect the first connection terminal, the second connection terminal, and the printed circuit board through the solder balls.

6. The method according to claim 1, wherein the semiconductor substrate is an image sensor substrate.

7. The method according to claim 1, wherein the semiconductor substrate includes a semiconductor chip.

8. The method according to claim 1, wherein forming the second connection terminal comprises a damascene process.

9. The method of claim 1, further comprising bonding the semiconductor support substrate and a printed circuit board to electrically connect the first connection terminal, the second connection terminal, and the printed circuit board through the conductive material.

10. The method according to claim 9, wherein the conductive material includes solder balls.

11. The method according to claim 10, wherein:
    the solder balls comprise a first solder ball and a second solder ball; and
    the first connection terminal, the second connection terminal, and the printed circuit board are electrically connected by the first solder ball and the second solder ball.

12. The method of claim 1, wherein the conductive material is filled or deposited in the through via after the through via is formed in the semiconductor support substrate.

13. The method according to claim 12, wherein the conductive material is filled or deposited in the through via by electroplating.

14. The method according to claim 1, wherein the conductive material includes solder balls.

15. A method comprising:
    forming a first connection terminal configured for signal transfer by electrical connection to a wiring in a top portion of a semiconductor substrate;
    forming a via in a semiconductor support substrate;
    filling a conductive material in the via;
    after filling the conductive material in the via, forming a second connection terminal on the semiconductor support substrate, the second connection terminal contacting the conductive material;
    after forming the second connection terminal on the semiconductor support substrate, bonding the semiconductor substrate and the semiconductor support substrate such that the first connection terminal and a second connection terminal are bonded to each other;
    after bonding the semiconductor substrate and the semiconductor support substrate, forming a planarization layer, color filters, and microlenses on the semiconductor substrate, forming an adhesive layer on the planarization layer and an outer shell of the color filter and the microlenses, and forming a glass substrate over the color filters and microlenses, wherein the adhesive layer supports the glass substrate.

16. The method according to claim 15, wherein forming the second connection terminal on the semiconductor support substrate forms an inner second connection terminal, and filling the conductive material in the through via also forms an outer second connection terminal on the semiconductor support substrate at an end of the conductive material opposite from the inner second connection terminal.

17. The method according to claim 16, wherein forming the through via, filling the conductive material in the through via, and forming the outer second connection terminal comprises a dual damascene process.

18. The method according to claim 15, wherein the semiconductor substrate is an image sensor substrate.

19. The method according to claim 15, further comprising bonding the semiconductor support substrate and a printed circuit board to electrically connect the first connection terminal, the second connection terminal, and the printed circuit board through the conductive material.

\* \* \* \* \*